(12) United States Patent
Choi et al.

(10) Patent No.: US 8,592,809 B2
(45) Date of Patent: Nov. 26, 2013

(54) ORGANIC LIGHT-EMITTING DISPLAY DEVICE AND METHOD OF MANUFACTURING THE SAME

(75) Inventors: Chaun-Gi Choi, Yongin (KR); Ki-Ju Im, Yongin (KR); Hui-Won Yang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 106 days.

(21) Appl. No.: 12/926,174

(22) Filed: Oct. 29, 2010

(65) Prior Publication Data

US 2011/0163309 A1 Jul. 7, 2011

(30) Foreign Application Priority Data

Jan. 7, 2010 (KR) ........................ 10-2010-0001313

(51) Int. Cl.
*H01L 29/10* (2006.01)
*H01L 29/12* (2006.01)

(52) U.S. Cl.
USPC .......... 257/43; 257/59; 257/72; 257/E33.064; 438/149

(58) Field of Classification Search
USPC ................ 257/43, 59, 72, E33.064; 438/149
See application file for complete search history.

(56) References Cited

U.S. PATENT DOCUMENTS

| | | | | |
|---|---|---|---|---|
| 5,500,750 A * | 3/1996 | Kanbe et al. | ..................... | 349/42 |
| 6,081,305 A * | 6/2000 | Sato et al. | ......................... | 349/5 |
| 6,559,036 B1 * | 5/2003 | Ohtani et al. | ................. | 438/486 |
| 7,202,497 B2 * | 4/2007 | Ohtani et al. | ................... | 257/59 |
| 2001/0046011 A1 * | 11/2001 | Yasukawa | ..................... | 349/113 |
| 2007/0123135 A1 | 5/2007 | Yang et al. | | |
| 2008/0231168 A1 | 9/2008 | Choi | | |
| 2009/0009069 A1 | 1/2009 | Takata | | |
| 2009/0039773 A1 | 2/2009 | Jun et al. | | |
| 2009/0091254 A1 | 4/2009 | Jeong et al. | | |
| 2009/0195148 A1 | 8/2009 | Lee et al. | | |
| 2010/0090223 A1 * | 4/2010 | Kitakado et al. | ................ | 257/71 |
| 2010/0091212 A1 * | 4/2010 | Moon et al. | ..................... | 349/43 |
| 2011/0006297 A1 * | 1/2011 | Inoue et al. | ..................... | 257/43 |

FOREIGN PATENT DOCUMENTS

| | | |
|---|---|---|
| JP | 2008-234932 A | 10/2008 |
| JP | 2009-032673 A | 2/2009 |
| KR | 10 2007-0056469 A | 6/2007 |
| KR | 10 2008-0037841 A | 5/2008 |
| KR | 10-0838090 B1 | 6/2008 |
| KR | 10 2008-0086201 A | 9/2008 |
| KR | 10 2008-0102665 A | 11/2008 |
| KR | 10 2009-0041312 A | 4/2009 |
| KR | 10 2009-0085231 A | 8/2009 |

* cited by examiner

*Primary Examiner* — Phat X Cao
(74) *Attorney, Agent, or Firm* — Lee & Morse, P.C.

(57) ABSTRACT

An organic light-emitting display device includes a substrate, a plurality of thin-film transistors on the substrate, each thin-film transistor including an active layer, a planarization layer on the thin-film transistors, a first electrode on the planarization layer and electrically connected to a thin-film transistor, and an ion blocking layer on the planarization layer, the ion blocking layer overlapping the active layer.

19 Claims, 11 Drawing Sheets

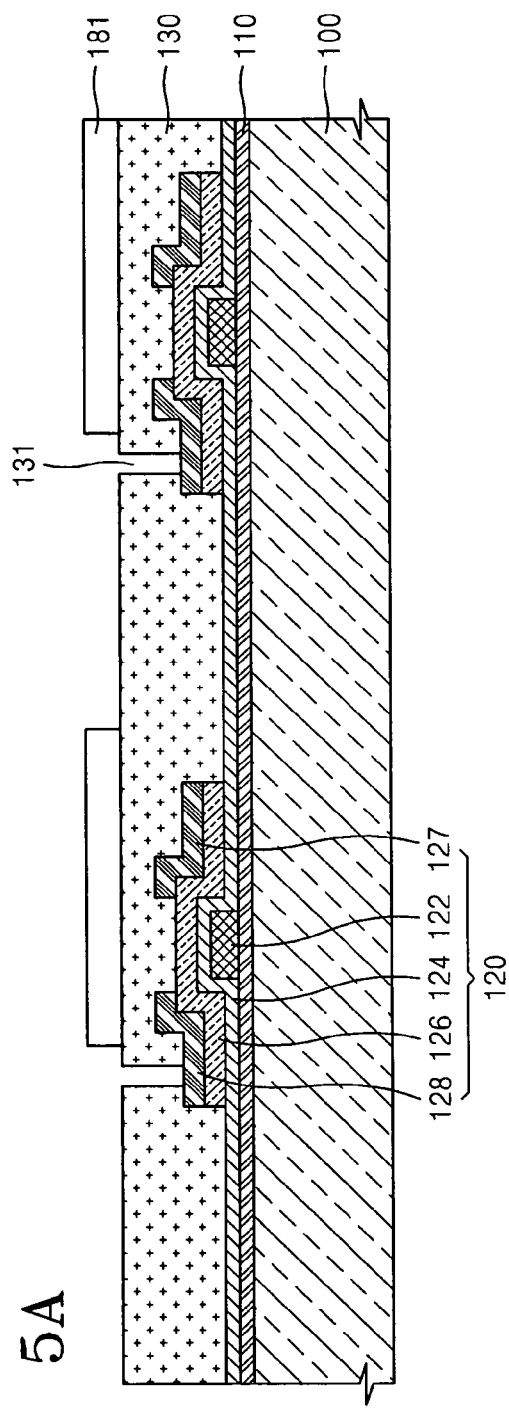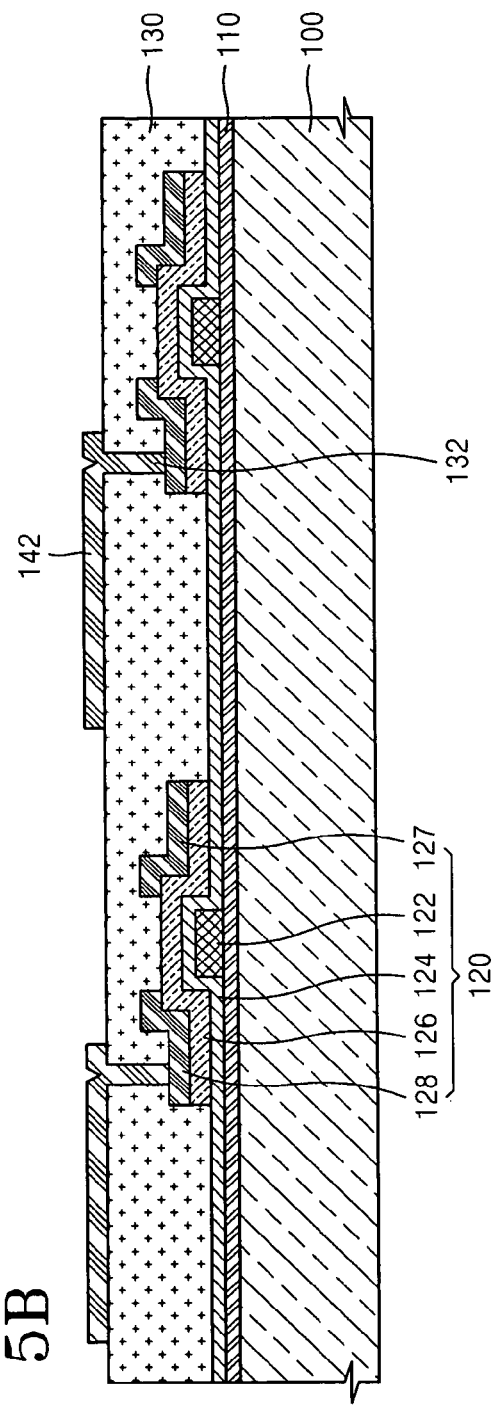

ORGANIC LIGHT-EMITTING DISPLAY DEVICE AND METHOD OF MANUFACTURING THE SAME

BACKGROUND

1. Field

Example embodiments relate to an organic light-emitting display device and a method of manufacturing the same. More particularly, example embodiments relate to an organic light-emitting display device that can prevent deterioration of an active layer of a thin-film transistor and a method of manufacturing the organic light-emitting display device.

2. Description of the Related Art

Organic light-emitting display devices exhibit many advantages, e.g., wide viewing angle, good contrast, and rapid response speed, and thus, have been highlighted as next generation display devices. An organic light-emitting display device may include a light-emitting layer formed of an organic material between an anode electrode and a cathode electrode, and a transistor with an active layer.

The active layer of the transistor, e.g., included in an active matrix organic light-emitting display device (AMOLED), may include a crystalline silicon, an amorphous silicon, an organic semiconductor, or an oxide semiconductor.

SUMMARY

Embodiments are therefore directed to an organic light-emitting display device and a method of manufacturing the same, which substantially overcome one or more of the problems due to the limitations and disadvantages of the related art.

It is therefore a feature of an embodiment to provide an organic light-emitting display device having an ion blocking layer configured to prevent deterioration of an active layer of a thin-film transistor.

It is therefore another feature of an embodiment to provide a method of manufacturing an organic light-emitting display device having an ion blocking layer configured to prevent deterioration of an active layer of a thin-film transistor.

At least one of the above and other features and advantages may be realized by providing an organic light-emitting display device, including a substrate, a plurality of thin-film transistors on the substrate, each thin-film transistor including an active layer, a planarization layer on the thin-film transistors, a first electrode on the planarization layer and electrically connected to the thin-film transistor, and an ion blocking layer on the planarization layer, the ion blocking layer overlapping the active layer.

The active layer may include an oxide semiconductor material. The oxide semiconductor material may include at least one of zinc oxide (ZnO), tin oxide (SnO), gallium-indium-zinc oxide (Ga—In—Zn—O), indium-zinc oxide (In—Zn—O), and indium-tin oxide (In—Sn—O). The oxide semiconductor material may be doped with at least one of aluminum (Al), nickel (Ni), copper (Cu), tantalum (Ta), hafnium (Hf), and titanium (Ti). The active layer may include polycrystalline silicon.

The ion blocking layer may be formed to correspond to each of the thin-film transistors. The ion blocking layer may be formed as one body.

The first electrode and the ion blocking layer may be insulated from each other. The first electrode and the ion blocking layer may be formed on the same plane. The first electrode and the ion blocking layer may be formed of the same material. The first electrode and the ion blocking layer may be formed of different materials. The ion blocking layer may include a conductive material.

The organic light-emitting display device may further include a ground electrically connected to the ion blocking layer. The thin-film transistor may have a bottom gate structure in which a gate electrode is formed on the substrate and the active layer is formed over the gate electrode.

At least one of the above and other features and advantages may also be realized by providing an organic light-emitting display device, including a substrate including a pixel region and a non-pixel region, a plurality of thin-film transistors formed on the non-pixel region of the substrate and each including an active layer, a first electrode formed on the pixel region of the substrate and electrically connected to the thin-film transistor, and an ion blocking layer formed on the non-pixel region so as to cover the active layer.

At least one of the above and other features and advantages may also be realized by providing a method of manufacturing an organic light-emitting display device, the method including forming a plurality of thin-film transistors each including an active layer on a substrate, forming a planarization layer on the thin-film transistor so as to cover the thin-film transistors, forming a first electrode and an ion blocking layer on the planarization layer, forming a pixel defining layer so as to cover the ion blocking layer and to expose a part of the first electrode, and forming an organic material layer and a second electrode on the first electrode to form a unit pixel.

The forming of the first electrode and the ion blocking layer may include forming a conductive layer on the planarization layer, forming a first mask pattern on the conductive layer, and removing a part of the conductive layer using the first mask pattern as an etching mask to form the first electrode and the ion blocking layer at the same time.

The forming of the first electrode and the ion blocking layer may include forming a second mask pattern on the planarization layer so as to cover a region where the ion blocking layer is formed and to expose a region where the first electrode is formed, forming the first electrode on the planarization layer exposed by the second mask pattern, removing the second mask pattern, forming a third mask pattern on the planarization layer so as to cover the first electrode and to expose a region where the ion blocking layer is formed, forming the ion blocking layer on the planarization layer exposed by the third mask pattern, and removing the third mask pattern.

The forming of the first electrode and the ion blocking layer may include forming a fourth mask pattern on the planarization layer so as to cover a region where the first electrode is formed and to expose a region where the ion blocking layer is formed, forming the ion blocking layer on the planarization layer exposed by the fourth mask pattern, removing the fourth mask pattern, forming a fifth mask pattern on the planarization layer so as to cover the ion blocking layer and to expose a region where the first electrode is formed, forming the first electrode on the planarization layer exposed by the fifth mask pattern, and removing the fifth mask pattern.

The forming of the first electrode and the ion blocking layer may include forming a sixth mask pattern on the planarization layer so as to expose a region where the first electrode is formed and a region where the ion blocking layer is formed, forming the first electrode and the ion blocking layer at the same time on the planarization layer exposed by the sixth mask pattern, and removing the sixth mask pattern.

BRIEF DESCRIPTION OF THE DRAWINGS

The above and other features and advantages will become more apparent to those of ordinary skill in the art by describing in detail exemplary embodiments with reference to the attached drawings, in which:

FIGS. 5A through 5C illustrate cross-sectional views of stages in a method of manufacturing an organic light-emitting display device according to another embodiment;

DETAILED DESCRIPTION

Figure 1:
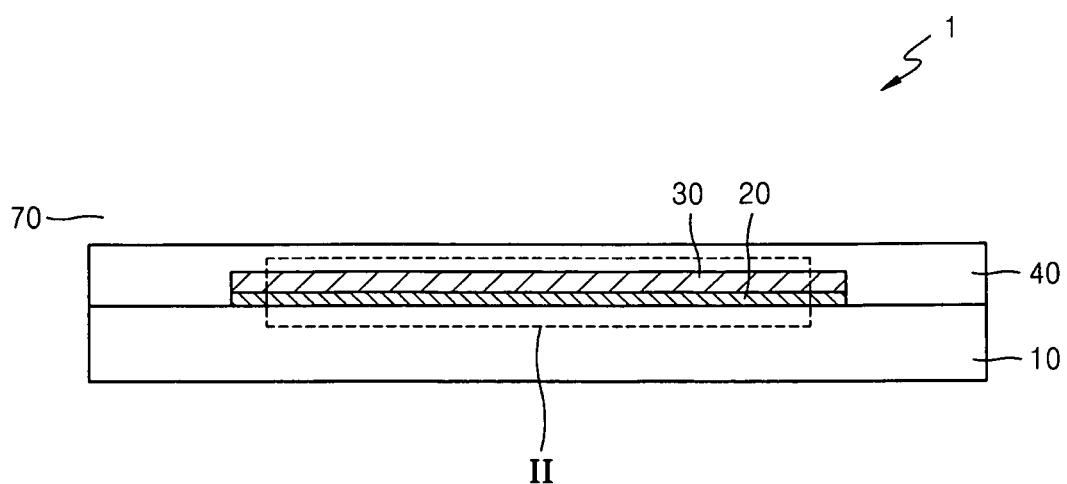
FIG. 1 illustrates a cross-sectional view of an organic light-emitting display device according to an embodiment.

Korean Patent Application No. 10-2010-0001313, filed on Jan. 7, 2010, in the Korean Intellectual Property Office, and entitled: "Organic Light-Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
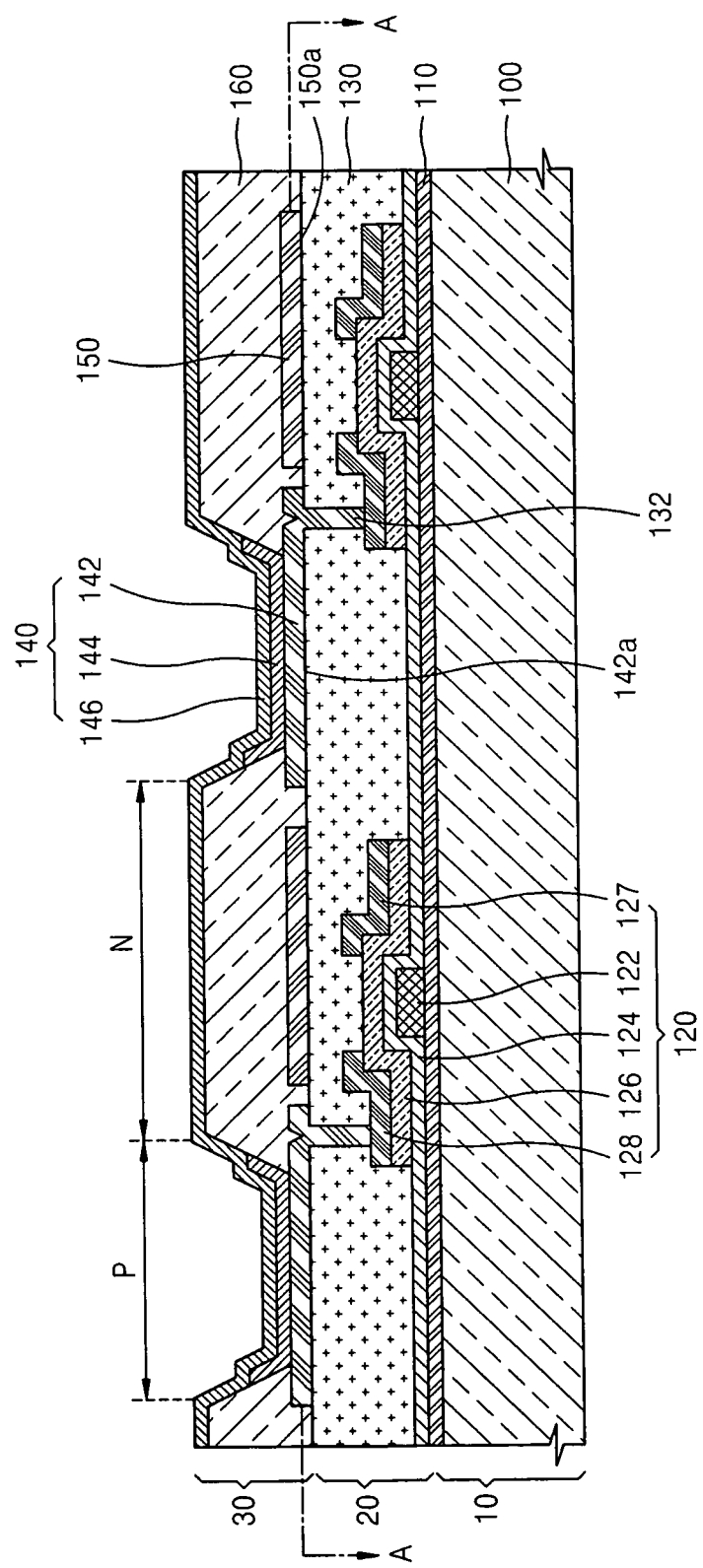
FIG. 2 illustrates an enlarged cross-sectional view of part II in FIG. 1.

FIG. 1 illustrates a cross-sectional view of an organic light-emitting display device according to an embodiment. FIG. 2 illustrates an enlarged cross-sectional view of part II of FIG. 1.

Referring to FIG. 1, an organic light-emitting display device 1 may include a base 10, an element unit 20 formed on the base 10, a display unit 30 formed on the element unit 20, and a sealing unit 40 for sealing the element unit 20 and the display unit 30. The organic light-emitting display device 1 will be described in more detail below with reference to FIG. 2, which schematically illustrates the base 10, the element unit 20, and the display unit 30 of the organic light-emitting display device 1 of FIG. 1.

Referring to FIG. 2, the base 10 may include a substrate 100. The element unit 20 may include a thin-film transistor 120 formed on the substrate 100. The display unit 30 may include a pixel region P, i.e., where light is emitted, and a non-pixel region N. The pixel region P may include a plurality of unit pixels 140, each including a first electrode 142, an organic material layer 144, and a second electrode 146. The non-pixel region N may be formed between the unit pixels 140, i.e., a region where the thin-film transistor 120 is located, and may include a pixel defining layer (PDL) 160.

The substrate 100 may be formed of a transparent material, e.g., a transparent glass or a transparent plastic, or an opaque material. For example, in a bottom emission type organic light-emitting display device, i.e., a device in which an image is displayed in a direction toward the substrate 100, or in a dual emission type organic light-emitting display device, the substrate 100 may be formed of a transparent material. However, in a top emission type organic light-emitting display device, i.e., a device in which an image is displayed in a direction opposite to the substrate 100, the substrate 100 may be formed of an opaque material. For example, the substrate 100 may be formed of an organic plastic material, e.g., one or more of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP). In another example, the substrate 100 may be formed of carbon (C) or a metal, e.g., one or more of iron (Fe), chrome (Cr), manganese (Mn), nickel (Ni), titanium (Ti), molybdenum (Mo), stainless steel, an invar alloy, an inconel alloy, and a kovar alloy. The substrate 100 may also be formed of a metal foil. The above-mentioned materials for forming the substrate 100 are examples, and thus, example embodiments are not limited thereto.

The substrate 100 may optionally include a buffer layer 110 thereon. The buffer layer 110 may planarize the substrate 100 and prevent impurities from entering the substrate 100. The buffer layer 110 may be formed of an inorganic material and/or an organic material. Examples of the inorganic material may include one or more of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium-strontium titanium oxide (BST), and lead-zirconium-titanium oxide (PZT). Examples of the organic material may include one or more of poly methylmethacrylate (PMMA), polystyrene (PS), phenol-based polymer, acryl-based polymer, imide-based polymer, e.g., polyimide, arylether-based polymer, amide-based polymer, fluorine-based polymer, p-xylene-based polymer, vinyl alcohol-based polymer, and parylene. The buffer layer 110 may be a combination of an inorganic insulating layer including the inorganic material and an organic insulating layer including the organic material. The buffer layer 110 may be formed by various methods, e.g., chemical vapor deposition (CVD), plasma enhanced CVD (PECVD), atmospheric pressure CVD (APCVD), low pressure CVD (LPCVD), photo CVD, hydrogen radical (HR) CVD, or electron cyclotron resonance CVD (ECR-CVD). Also, other layers described in the specification may be formed by the above-mentioned methods.

A plurality of thin-film transistors 120 may be formed on the substrate 100 or on the buffer layer 110. The thin-film transistor 120 may be formed in the non-pixel region N. Although not shown in FIG. 2, a plurality of capacitors (not shown) may be formed on the substrate 100 or on the buffer layer 110. The thin-film transistors 120 and the capacitors may be electrically connected to the display unit 30 so as to control light-emission of the display unit 30.

The thin-film transistor 120 may include a gate electrode 122, a gate insulating layer 124, an active layer 126, a source electrode 127, and a drain electrode 128. As illustrated in FIG. 2, the thin-film transistor 120 may have a bottom gate structure, in which the active layer 126 is formed over the gate electrode 122, i.e., the gate electrode 122 may be between the substrate 100 and the active layer 126. However, this is just an example, and example embodiments are not limited thereto.

For example, the thin-film transistor 120 may have a top gate structure, in which the gate electrode 122 is formed over the active layer 126, i.e., the active layer 126 may be between the substrate 100 and the gate electrode 122.

The gate electrode 122 may be formed on the substrate 100 or on the buffer layer 110 and may have conductivity. The gate electrode 122 may include a metal, e.g., one or more of aluminum (Al), chrome (Cr), copper (Cu), molybdenum (Mo), and tungsten (W). The gate electrode 122 may also include a conductive polymer. Although not shown in FIG. 2, the gate electrode 122 may be electrically connected to a gate line (not shown) for applying an on/off signal of the thin-film transistor 120.

The gate insulating layer 124 may be formed on the gate electrode 122 so as to cover the gate electrode 122. The gate insulating layer 124 insulates the gate electrode 122 from the active layer 126. The gate insulating layer 124 may be formed to cover the entire buffer layer 110 or may have a pattern shape that covers a part of the buffer layer 110. The gate insulating layer 124 may include an inorganic material, e.g., one or more of $SiO_2$, $SiN_x$, SiON, $Al_2O_3$, $TiO_2$, $Ta_2O_5$, $HfO_2$, $ZrO_2$, BST, and PZT. The gate insulating layer 124 may also include an organic material, e.g., PMMA, PS, phenol-based polymer, acryl-based polymer, imide-based polymer such as polyimide, arylether-based polymer, amide-based polymer, fluorine-based polymer, p-xylene-based polymer, vinyl alcohol-based polymer, and parylene.

The active layer 126 may be formed on the gate insulating layer 124. The active layer 126 may be formed to correspond to, e.g., overlap, the gate electrode 122. The active layer 126 may include source and drain regions doped with n-type or p-type impurities, and a channel region for connecting the source region and the drain region to each other. In general, the source region and the drain region are respectively formed in both ends of the active layer 126, and the channel region is formed in a center of the active layer 126. The active layer 126 may include a semiconductor material, e.g., polycrystalline silicon or an oxide semiconductor material. When the active layer 126 is formed of polycrystalline silicon, the polycrystalline silicon may be formed using a direct deposition method, e.g., CVD, PECVD, APCVD, LPCVD, photo CVD, HR CVD, or ECR-CVD. The polycrystalline silicon may also be formed by depositing an amorphous silicon layer and then crystallizing the amorphous silicon layer. For example, the polycrystalline silicon may be formed by rapid thermal annealing (RTA), solid phase crystallization (SPC), excimer laser annealing (ELA), metal-induced crystallization (MIC), metal-induced lateral crystallization (MILC), or sequential lateral solidification (SLS).

When the active layer 126 is formed of an oxide semiconductor material, the oxide semiconductor material may include, e.g., one or more of zinc oxide (ZnO), tin oxide (SnO), gallium-indium-zinc oxide (Ga—In—Zn—O), indium-zinc oxide (In—Zn—O), and indium-tin oxide (In—Sn—O). The oxide semiconductor material may also be a material in which at least one of Al, Ni, Cu, Ta, Hf, and Ti is doped on the above materials. The oxide semiconductor material has an electron mobility that is higher than that of an amorphous silicon. The oxide semiconductor material may also be transparent and may be easily manufactured, e.g., via a low-temperature process. However, the oxide semiconductor material may be sensitive to changes in an external environment, and thus, may deteriorate during a manufacturing process. For example, while a process for forming an organic thin film display device, e.g., a plasma treatment or an organic material deposition, is performed, the characteristics of the organic thin film display device may deteriorate, and thus, the reliability of the thin-film transistor 120 may be decreased.

Although not shown in FIG. 2, an ohmic contact layer may further be formed on the active layer 126. The ohmic contact layer may be formed by doping the active layer 126 with predetermined conductive impurities. Also, although not shown in FIG. 2, an etching stop layer including an insulating layer, e.g., a silicon oxide or a silicon nitride layer, may further be formed on the active layer 126.

The source electrode 127 and the drain electrode 128 may be formed on the active layer 126. The source electrode 127 and the drain electrode 128 may be spaced apart from each other, and may be electrically connected to each other via the active layer 126 functioning as a channel. The source electrode 127 and the drain electrode 128 may be electrically connected to the source region and the drain region of the active layer 126, respectively. Both the source electrode 127 and the drain electrode 128 have conductivity and may include Cu, Ag, Ni, or Fe. The source electrode 127 and the drain electrode 128 may also include the same material or different materials. Although not shown in FIG. 2, the source electrode 127 may be electrically connected to a data line (not shown), and the drain electrode 128 may be electrically connected to the first electrode 142 of the pixel region P.

A planarization layer 130 may be formed on the thin-film transistor 120 so as to cover the thin-film transistor 120. The planarization layer 130 may have a single layer structure or a multi-layer structure. For example, the planarization layer 130 may be formed by stacking an inorganic material layer, e.g., including a silicon oxide and/or a silicon nitride, and an organic material layer, e.g., including acryl, polyimide, Benzocyclobutene (BCB), and the like. The planarization layer 130 may be formed using various methods, e.g., CVD, PECVD, APCVD, LPCVD, photo CVD, HR CVD, or ECR-CVD. A plug 132 may be formed inside the planarization layer 130 so as to electrically connect the drain electrode 128 and the first electrode 142 to each other.

The first electrode 142 and an ion blocking layer 150 may be formed on, e.g., directly on, the planarization layer 130, so as to respectively correspond to the pixel region P and the non-pixel region N. The first electrode 142 may be electrically connected to the thin-film transistor 120 via the plug 132. The ion blocking layer 150 may be formed over the active layer 126 to cover, e.g., overlap, the active layer 126. The ion blocking layer 150 may be electrically connected to a ground 170 (see FIG. 3A), and may prevent external ions from entering the active layer 126 during the manufacturing process. Thus, the ion blocking layer 150 may protect the active layer 126 from influences of an external environment or influences during the manufacturing process, e.g., the ion blocking layer 150 may protect an oxide semiconductor layer from changes in the external environment and reduce its deterioration during the manufacturing process. The first electrode 142 and the ion blocking layer 150 may also be electrically insulated from each other. The first electrode 142 and the ion blocking layer 150 may be formed at the same manufacturing step, and may be formed on the same plane, e.g., bottom surfaces 142a and 150a of the first electrode 142 and the ion blocking layer 150 may be substantially coplanar. However, this is just an example, and example embodiments are not limited thereto, e.g., the first electrode 142 and the ion blocking layer 150 may be formed at different steps and may be formed on different planes.

The first electrode 142 may be formed of a transparent electrode or a reflective electrode. When the first electrode 142 is formed of a transparent electrode, the first electrode 142 may include at least one of indium-tin oxide (ITO), indium-zinc oxide (IZO), zinc oxide (ZnO), and indium oxide (In$_2$O$_3$). When the first electrode 142 is formed of a reflective electrode, the first electrode 142 may include a reflective layer, e.g., a layer including at least one of Ag, magnesium (Mg), Al, platinum (Pt), palladium (Pd), gold (Au), Ni, neodymium (Nd), iridium (Ir), Cr, and Cu, and a transparent electrode layer, e.g., including at least one of ITO, IZO, ZnO, and In$_2$O$_3$, formed on the reflective layer. However, these materials are just examples, and example embodiments are not limited thereto. Furthermore, the first electrode 142 may have a single layer structure or a multi-layer structure. The first electrode 142 may be formed by using a general deposition method, e.g., CVD or sputtering, and then patterning, e.g., using a photolithography method. The ion blocking layer 150 may be formed of a material that is the same as or different from that of the first electrode 142.

The pixel defining layer (PDL) 160 may be formed on the ion blocking layer 150 so as to cover the ion blocking layer 150. The pixel defining layer 160 may expose at least a part of the first electrode 142, so the exposed first electrode 142 may define the unit pixel 140. That is, the pixel defining layer 160 may define the unit pixels 140. Furthermore, the pixel defining layer 160 may prevent a short circuit between the first electrode 142 and the second electrode 146. The pixel defining layer 160 may include an insulating material and may be transparent or opaque. The pixel defining layer 160 may include polyimide, but this is just an example, and thus, example embodiments are not limited thereto.

The second electrode 146 may be formed to face the first electrode 142. The second electrode 146 may be formed of a transparent electrode or a reflective electrode. When the second electrode 146 is formed of a transparent electrode, the second electrode 146 may include a metal layer, e.g., at least one of lithium (Li), calcium (Ca), calcium fluoride/calcium (LiF/Ca), LiF/Al, Al, Ag, and Mg, facing the first electrode 142, and a transparent auxiliary/but electrode line, e.g., formed of at least one of ITO, IZO, ZnO or In$_2$O$_3$, formed on the metal layer. When the second electrode 146 is formed of a reflective electrode, the second electrode 146 may be formed by completely depositing at least one of Li, Ca, LiF/Ca, LiF/Al, Al, Ag, and Mg. The second electrode 146 may be formed using a general deposition method, e.g., CVD or sputtering.

Locations of the first electrode 142 and the second electrode 146 may be exemplary, and thus, the locations thereof may be reversed. For example, the first electrode 142 and the second electrode 146 may be respectively an anode and a cathode, or vice-versa. The first electrode 142 may be formed of a material having a relatively high work function, whereas the second electrode 146 may be formed of a material having a relatively low work function, or vice-versa. Furthermore, the first electrode 142 may be patterned to correspond to a region of each unit pixel 140, and the second electrode 146 may be formed to cover the entire structure of the display unit 30. That is, the second electrode 146 may be formed to cover both the pixel region P and the non-pixel region N.

The organic material layer 144 may be formed between the first electrode 142 and the second electrode 146. When voltage is applied between the first electrode 142 and the second electrode 146, the organic material layer 144 emits light. The organic material layer 144 may emit light of different colors according to the material of the organic material layer 144. For example, the organic material layer 144 may emit light of the same color or may emit light of different colors, e.g., red, blue, and/or green.

For example, the organic material layer 144 may be formed using a low molecular weight organic material. In this case, the organic material layer 144 may include a hole injection layer (HIL), a hole transport layer (HTL), an organic emission layer (EML), an electron transport layer (ETL), and an electron injection layer (EIL) that are sequentially stacked, and each of the layers may have a single layer structure or a multi-layer structure. Organic materials used in the organic material layer 144 may be copper phthalocyanine (CuPc), N,N'-Di(naphthalene-1-yl)-N,N'-diphenyl-benzidine (NPB), tris-8-hydroxyquinoline aluminum (Alq3), or the like. The low molecular weight organic material may be formed by vacuum deposition using masks. In another example, the organic material layer 144 may be formed using a polymer organic material. In this case, the organic material layer 144 may have a structure including the HTL and the EML. The HTL may include poly(3,4-ethylenedioxythiophene) (PE-DOT), and the EML may include a polymer organic material, e.g., a poly-phenylenevinylene (PPV)-based or polyfluorene-based polymer organic material. The organic material layer 144 may be formed by spin coating, laser induced thermal imaging (LITI), inkjet printing, or vacuum deposition.

Figure 3A:
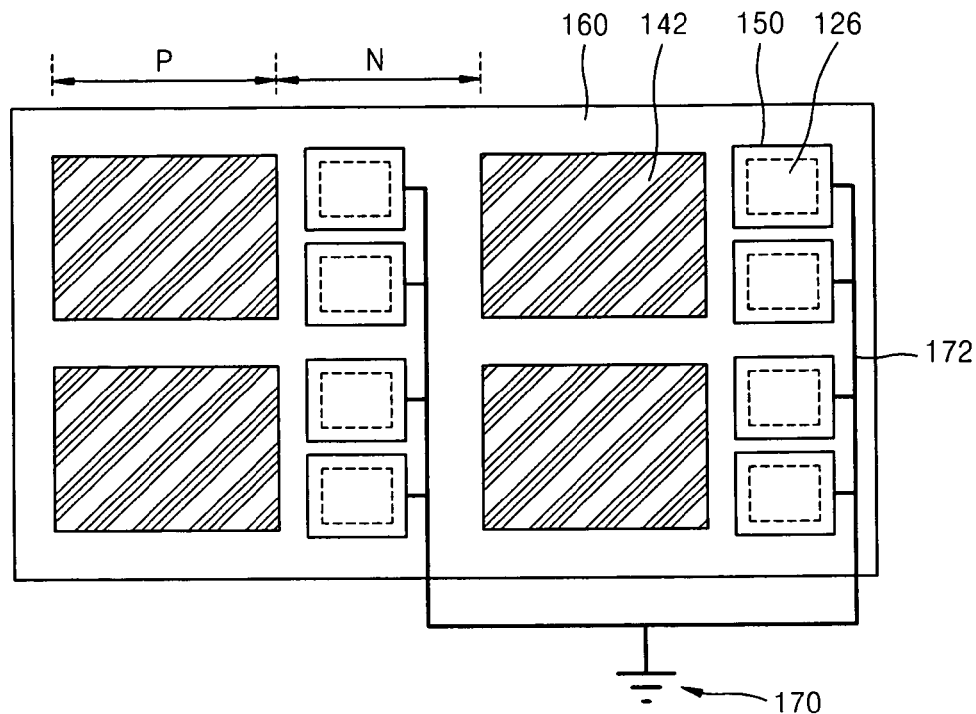
FIGS. 3A and 3B illustrate top plan views of an organic light-emitting display device according to embodiments, taken along A-A of FIG. 2.
Figure 3B:
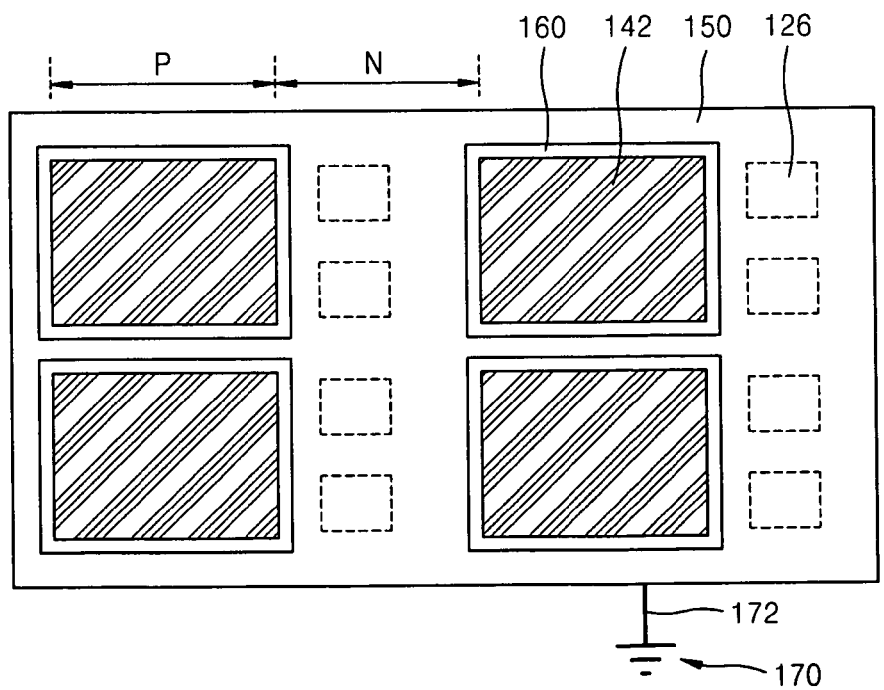

FIGS. 3A and 3B illustrate top plan views of the organic light-emitting display device 1 according to an embodiment. FIGS. 3A and 3B illustrate methods of arranging the first electrode 142 and the ion blocking layer 150 of FIG. 2, according to embodiments.

Referring to FIGS. 2 and 3A, the first electrode 142 may be formed in a pixel region P, and the ion blocking layer 150 may be formed in a non-pixel region N. The first electrode 142 and the ion blocking layer 150 may be formed on, e.g., directly on, the planarization layer 130, and may be spaced apart from each other horizontally by a pixel defining layer 160, i.e., a portion of the pixel defining layer 160 may be on the planarization layer 130 between the first electrode 142 and the ion blocking layer 150. Therefore, the first electrode 142 and the ion blocking layer 150 may be electrically insulated from each other.

The ion blocking layer 150 may be formed to cover, e.g., overlap, the thin-film transistor 120, e.g., to cover at least the active layer 126 of the thin-film transistor 120. As illustrated in FIG. 3A, the ion blocking layer 150 may be electrically connected to the ground 170 via a ground wire 172. For example, the ion blocking layer 150 may be separately formed to correspond to each of the plurality of thin-film transistors 120, i.e., a plurality of discrete portions of the ion blocking layer 150 may be formed spaced apart from each other to overlap respective active layers 126, so the separate portions, i.e., segments, of the ion blocking layer 150 and the first electrodes 142 may be arranged alternately on the planarization layer 130. As illustrated in FIG. 3A, the ion blocking layer 150 may have a quadrilateral shape, but this is just an example, and thus, the ion blocking layer 150 may have various shapes, e.g., a polygonal shape or a circular shape.

According to another configuration, as illustrated in FIG. 3B, the first electrode 142 may be formed in a pixel region P, and an ion blocking layer 150 may be formed over both the pixel region P and a non-pixel region N. For example, the ion blocking layer 150 may cover the active layer 126 in the non-pixel region N, and may surround the first electrode 142 in the pixel region P, i.e., the ion blocking layer 150 may be formed in an area of the pixel region P where the first electrode 142 is not formed. The first electrode 142 and the ion blocking layer 150 may be spaced apart from each other, and thus may be electrically insulated from each other. The ion blocking layer 150 may be formed to cover the thin-film transistor 120, e.g., to cover at least the active layer 126 of the thin-film transistor 120. The ion blocking layer 150 may be formed as one body. The ion blocking layer 150 may also be electrically connected to the ground 170 via the ground wire 172.

In FIGS. 3A and 3B, two, e.g., vertically arranged, thin-film transistors 120 are formed to correspond to one first electrode 142, i.e., to a single unit pixel 140. However, this is just an example, and thus, three or more thin-film transistors 120 may be formed to correspond to one unit pixel 140.

FIGS. 4A through 4F illustrate cross-sectional views of stages in a method of manufacturing the organic light-emitting display device 1.

Figure 4A:
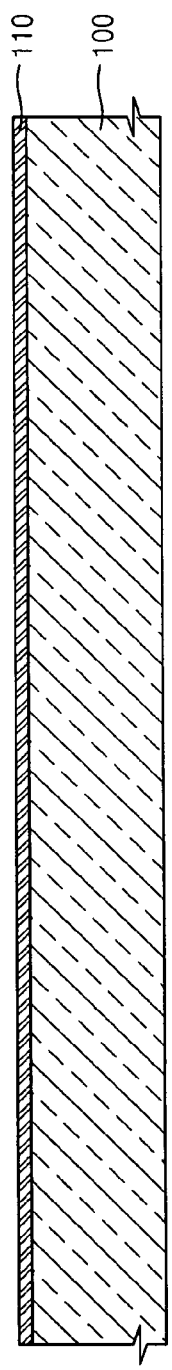
FIGS. 4A through 4F illustrate cross-sectional views of stages in a method of manufacturing an organic light-emitting display device according to an embodiment.

Referring to FIG. 4A, the substrate 100 may be prepared. The buffer layer 110 may be optionally formed on the substrate 100.

Figure 4B:
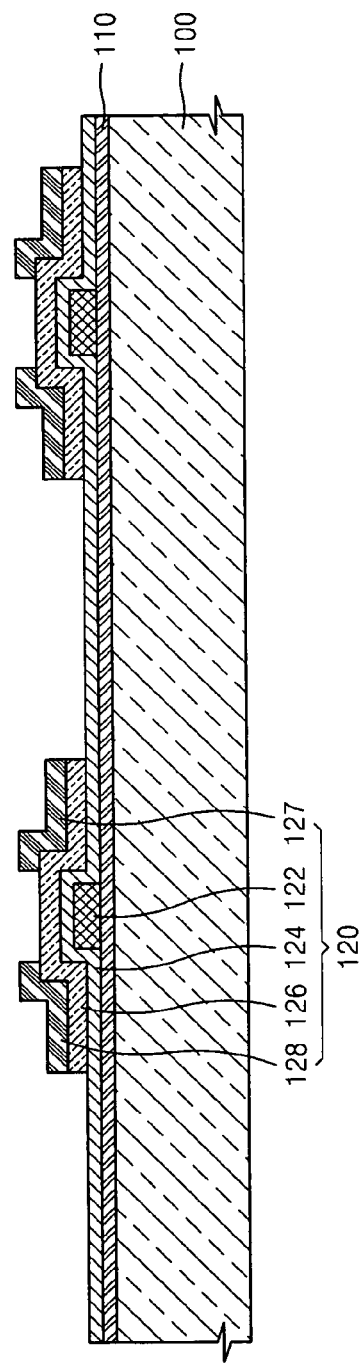

Referring to FIG. 4B, the plurality of thin-film transistors 120 may be formed on the buffer layer 110. Each of the thin film transistors 120 may include the gate electrode 122, the gate insulating layer 124, the active layer 126, the source electrode 127, and the drain electrode 128. The thin-film transistor 120 may be formed by CVD, PECVD, APCVD, LPCVD, photo CVD, HR CVD, or ECR-CVD or may be formed using a general photolithography method. The active layer 126 may include a semiconductor material, e.g., polycrystalline silicon or an oxide semiconductor material.

Figure 4C:
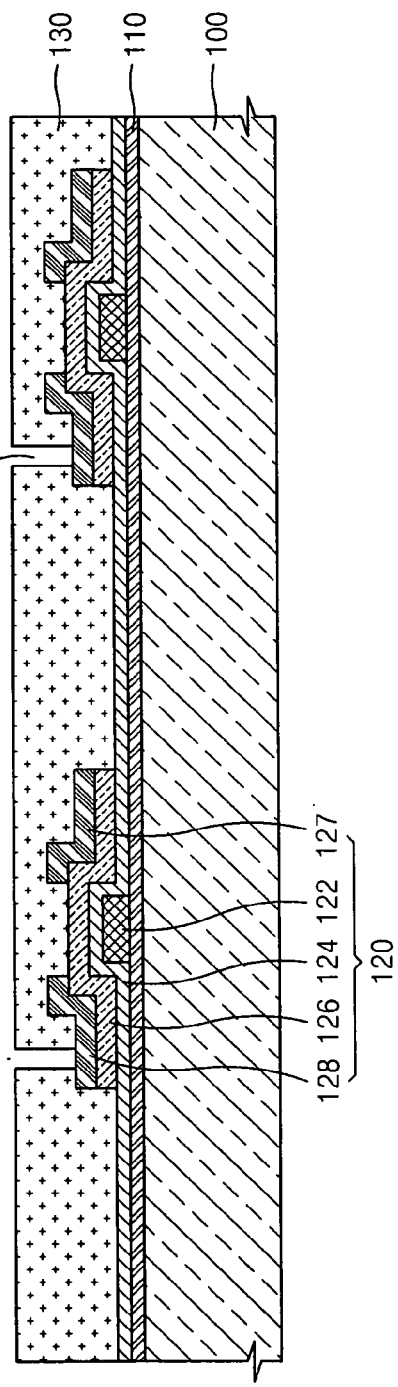

Referring to FIG. 4C, the planarization layer 130 may be formed on the thin-film transistor 120 so as to cover the thin-film transistor 120. The planarization layer 130 may be formed by CVD, PECVD, APCVD, LPCVD, photo CVD, HR CVD, or ECR-CVD. Then, an opening may be formed in the planarization layer 130 so as to penetrate the planarization layer 130 and to expose a part of the drain electrode 128.

Figure 4D:
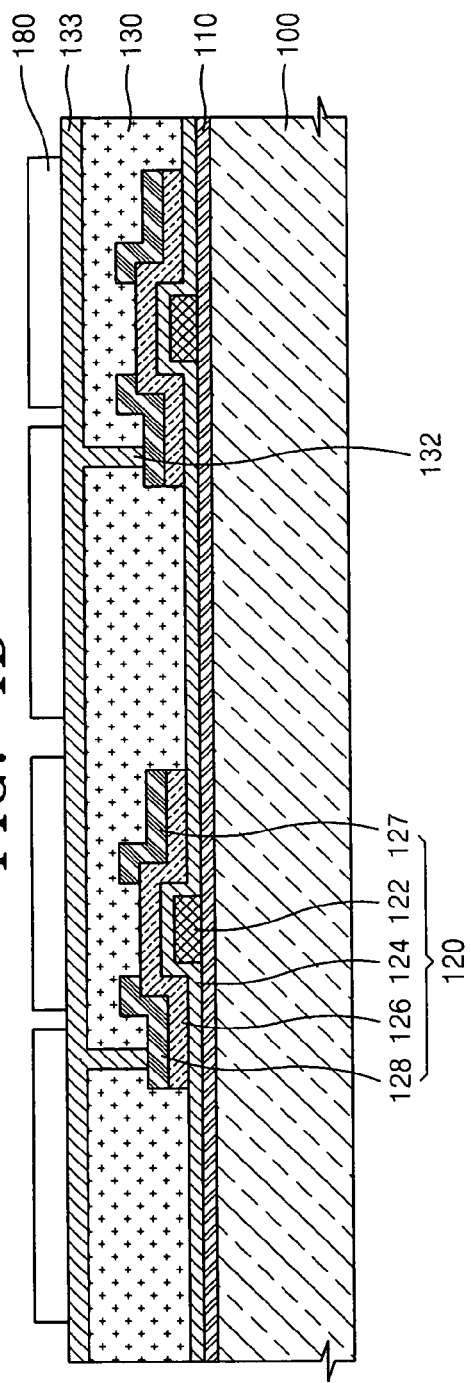

Referring to FIG. 4D, a conductive layer 133 formed of a conductive material may be formed on the planarization layer 130, such that the opening 131 may be buried by the conductive layer 133 to define the plug 132 electrically connected to the drain electrode 128. Then, a first mask pattern 180 may be formed on the conductive layer 133. The first mask pattern 180 may be a photoresist mask or a hard mask.

Figure 4E:
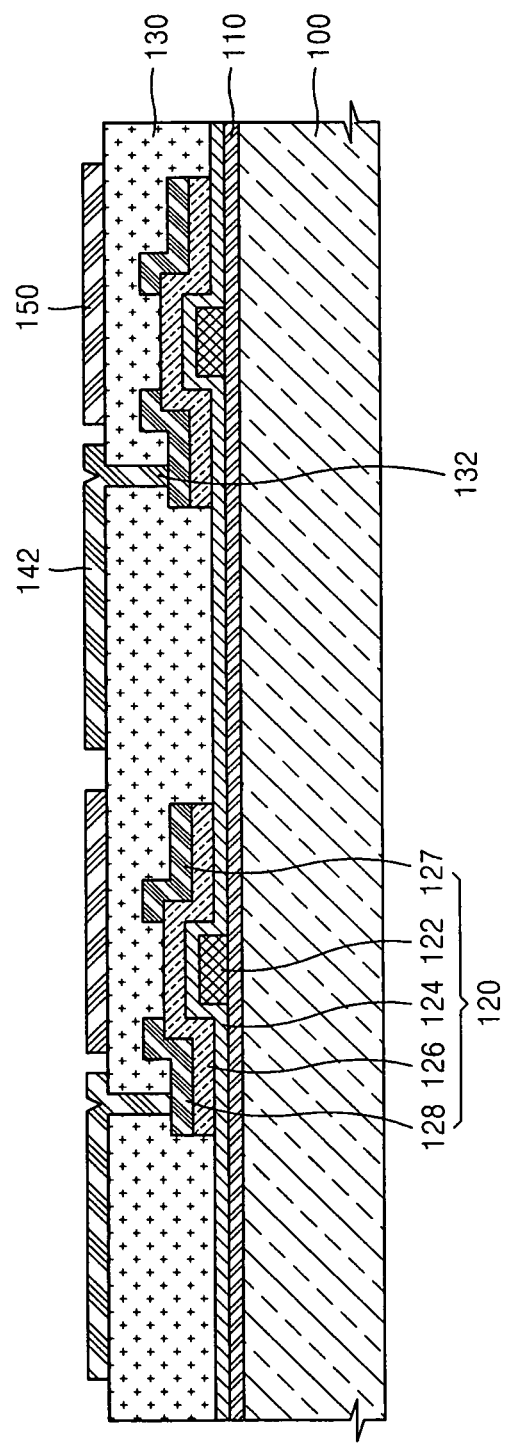

Referring to FIG. 4E, the conductive layer 133 may be patterned, so portions thereof may be removed using the first mask pattern 180 to form, e.g., simultaneously, the first electrode 142 and the ion blocking layer 150 on the planarization layer 130. The first electrode 142 and the ion blocking layer 150 may be electrically connected to each other. The ion blocking layer 150 may be formed to cover the thin-film transistor 120, e.g., at least cover the active layer 126 of the thin-film transistor 120.

Figure 4F:
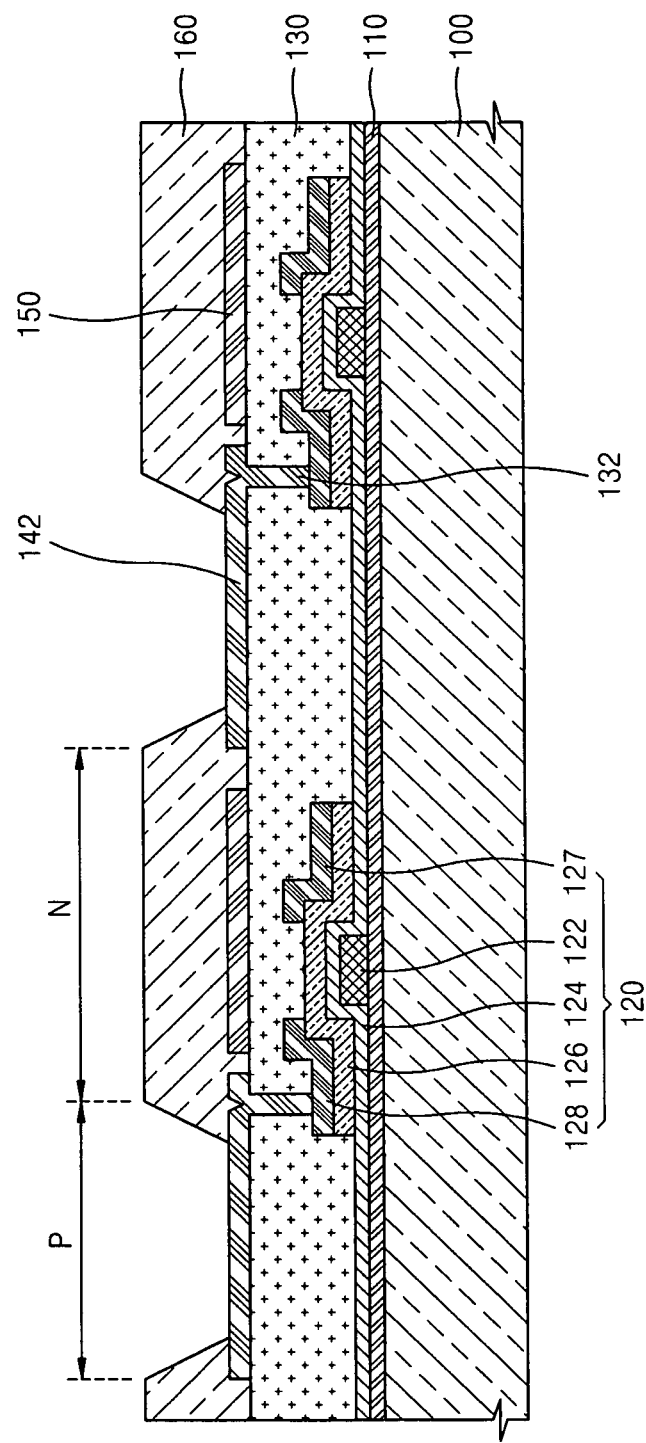

Referring to FIG. 4F, the pixel defining layer 160 may be formed to cover the ion blocking layer 150 and to expose a part of the first electrode 142. The pixel defining layer 160 may include an insulating material, e.g., polyimide, and may also be transparent or opaque. A portion of the pixel defining layer 160 may be positioned between the first electrode 142 and the ion blocking layer 150 to electrically insulate therebetween. The pixel defining layer 160 may define unit pixels 140, and then the organic material layer 144 and the second electrode 146 may be formed on the first electrode 142. That is, the unit pixel 140 including the first electrode 142, the organic material layer 144, and the second electrode 146 may be formed, thereby completing the manufacturing of the structure of FIG. 2.

In the manufacturing method according to the embodiment described with reference to FIGS. 4A through 4F, the conductive layer 133 may be formed on the planarization layer 130, a part of the conductive layer 133 may be removed, and then the first electrode 142 and the ion blocking layer 150 may be formed at the same time. In this case, the first electrode 142 and the ion blocking layer 150 may include the same material.

Figure 5C:
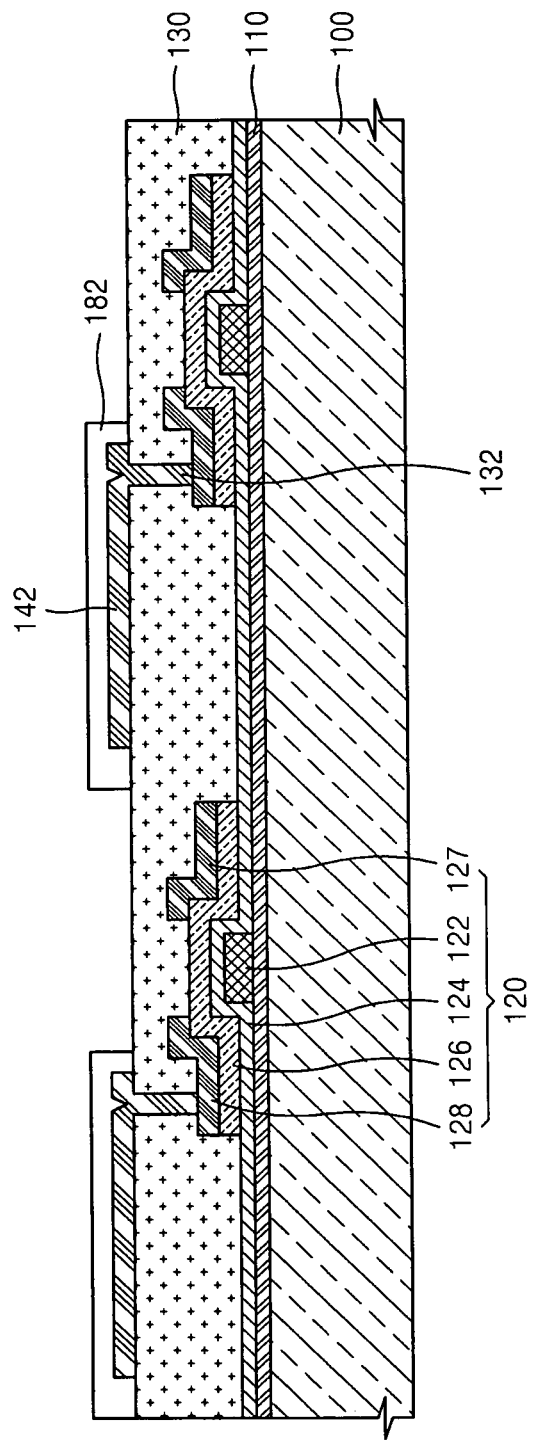

FIGS. 5A through 5C illustrate cross-sectional views of stages in a method of manufacturing the organic light-emitting display device 1 according to another embodiment. The manufacturing stages in FIGS. 5A-5C are performed following the stage illustrated in FIG. 4C described above.

In detail, referring to FIG. 5A, a second mask pattern 181 may be formed on the structure of FIG. 4C, i.e., on the planarization layer 130, so as to expose a part of the planarization layer 130. The second mask pattern 181 may cover a region where the ion blocking layer 150 is formed and expose a region where the first electrode 142 is formed.

Referring to FIG. 5B, a conductive layer (not shown) may be formed on the planarization layer 130 exposed by the second mask pattern 181 to form the first electrode 142. In this case, the plug 132 may be formed at the same time. Then, the second mask pattern 181 may be removed.

Referring to FIG. 5C, a third mask pattern 182 may be formed on the planarization layer 130, so as to expose a part of the planarization layer 130 and to cover the first electrode 142. The third mask pattern 182 may expose a region where the ion blocking layer 150 is formed. Then, a conductive layer (not shown) may be formed on the planarization layer 130 exposed by the third mask pattern 182 to form the ion blocking layer 150. Then, the third mask pattern 182 may be removed, thereby completing the manufacturing of the structure of FIG. 4E. Then, the processes described with reference to FIG. 4F may be performed.

In the manufacturing method according to the embodiment described with reference to FIGS. 5A through 5C, the first electrode 142 and the ion blocking layer 150 may be formed sequentially using the second and third mask patterns 181 and 182, respectively. In this case, the first electrode 142 and the ion blocking layer 150 may include the same material or different materials.

Figure 6A:
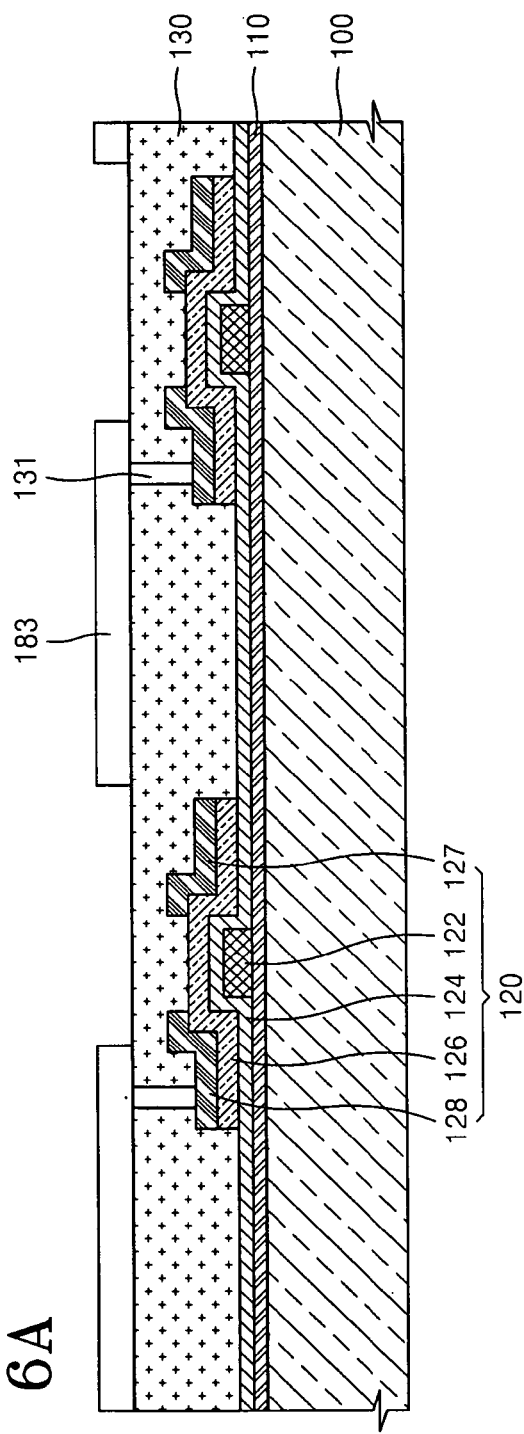
FIGS. 6A through 6C illustrate cross-sectional views of stages in a method of manufacturing an organic light-emitting display device according to another embodiment.
Figure 6B:
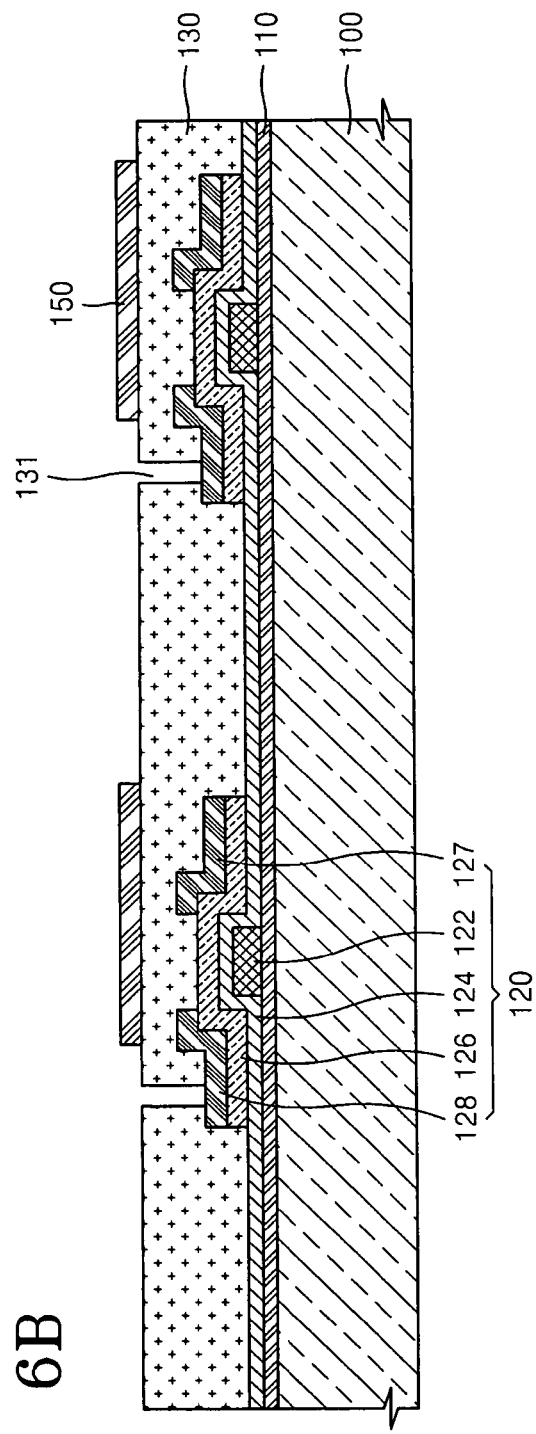
Figure 6C:
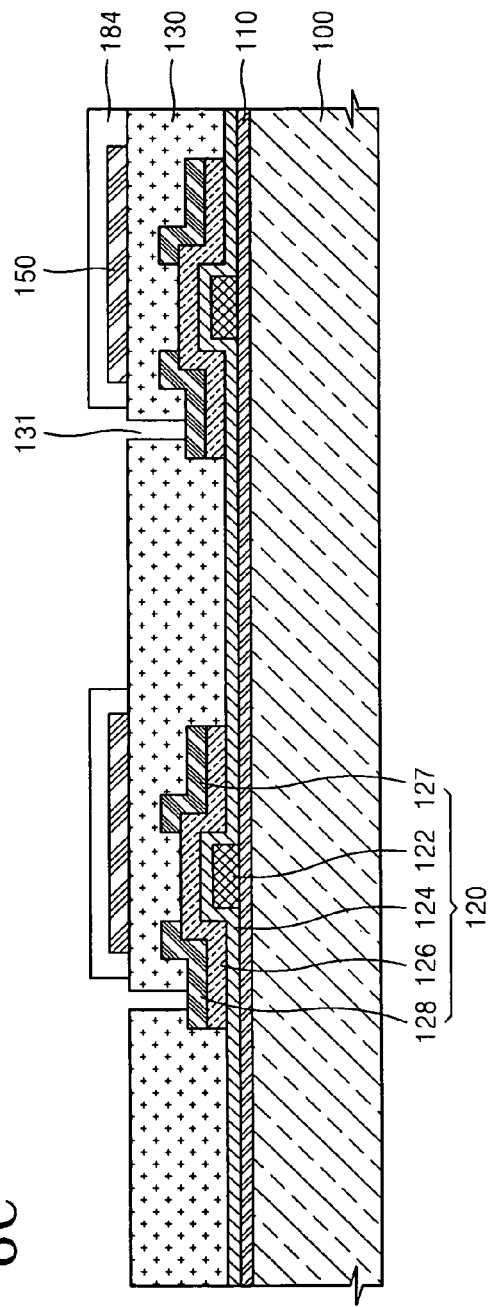

FIGS. 6A through 6C illustrate cross-sectional views of stages in a method of manufacturing the organic light-emitting display device 1, according to another embodiment. The manufacturing stages in FIGS. 6A-6C are performed following the stage illustrated in FIG. 4C and described above.

Referring to FIG. 6A, a fourth mask pattern 183 may be formed on the structure of FIG. 4C, i.e., on the planarization layer 130, so as to expose a part of the planarization layer 130. The fourth mask pattern 183 may cover a region where the first electrode 142 is formed and expose a region where the ion blocking layer 150 is formed.

Referring to FIG. 6B, a conductive layer (not shown) may be formed on the planarization layer 130 exposed by the fourth mask pattern 183 to form the ion blocking layer 150. Then, the fourth mask pattern 183 may be removed.

Referring to FIG. 6C, a fifth mask pattern 184 may be formed on the planarization layer 130, so as to expose a part of the planarization layer 130 and to cover the ion blocking layer 150. The fifth mask pattern 184 may expose a region where the ion blocking layer 150 is formed. Then, a conductive layer (not shown) may be formed on the planarization layer 130 exposed by the fifth mask pattern 184 to form the first electrode 142. In this case, the plug 132 may be formed at the same time. Then, the fifth mask pattern 184 may be removed, thereby completing the manufacturing of the structure of FIG. 4E. Then, the processes described with reference to FIG. 4F may be performed.

In the manufacturing method according to the embodiment described with reference to FIGS. 6A through 6C, the ion blocking layer 150 may be formed on the planarization layer 130, and then the first electrode 142 may be formed using the fourth and fifth mask patterns 183 and 184. In this case, the first electrode 142 and the ion blocking layer 150 may include the same material or different materials.

Figure 7:
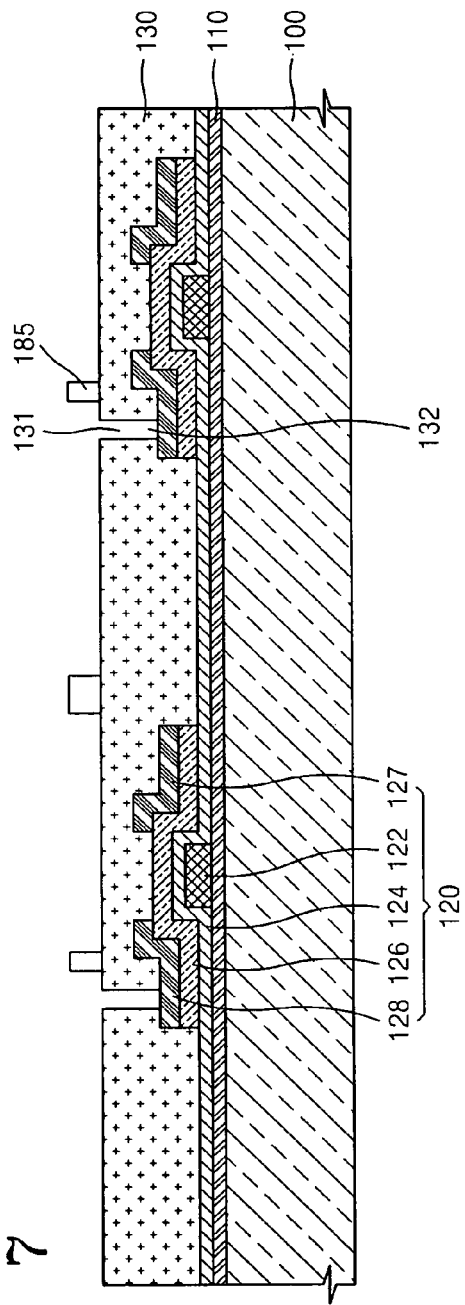
FIG. 7 illustrates a cross-sectional view of a method of manufacturing an organic light-emitting display device according to another embodiment.

FIG. 7 illustrates a cross-sectional view of a method of manufacturing the organic light-emitting display device 1, according to another embodiment. The manufacturing stage in FIG. 7 is performed following the stage illustrated in FIG. 4C and described above.

Referring to FIG. 7, a sixth mask pattern 185 may be formed on the planarization layer 130, so as to expose a part of the planarization layer 130. The sixth mask pattern 185 may cover a region where the first electrode 142 and the ion blocking layer 150 are not formed. A conductive layer (not shown) may be formed on the planarization layer 130 exposed by the sixth mask pattern 185, i.e., a region where the first electrode 142 and the ion blocking layer 150 are to be formed, to form the first electrode 142 and the ion blocking layer 150 simultaneously. In this case, the plug 132 may be formed at the same time. Then, the sixth mask pattern 185 is removed. In this case, the first electrode 142 and the ion blocking layer 150 may include the same material. Thus, the structure of FIG. 4E is completed, and the processes described with reference to FIG. 4F may be performed.

In the organic light-emitting display device according to example embodiments, an ion blocking layer may be formed to cover a thin-film transistor, so the active layer of the thin-film transistor may be protected from external ions. As such, the ion blocking layer may prevent the active layer of the thin-film transistor from deteriorating, and may be used in a bottom emission type, top emission type, and a dual emission type organic light-emitting display devices.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
a substrate;
a plurality of thin-film transistors on the substrate, each thin-film transistor including an active layer;
a planarization layer on the thin-film transistors;
a plurality of unit pixels on the planarization layer, each unit pixel including an organic light emitting layer between a first electrode and a second electrode, and the first electrode of the unit pixel being on the planarization layer and electrically connected to a corresponding thin-film transistor; and
an ion blocking layer on the planarization layer, the ion blocking layer overlapping the active layer of the corresponding thin film transistor and being spaced apart along a horizontal direction from the entire first electrode, and bottom surfaces of the first electrode and the ion blocking layer being substantially coplanar.

2. The organic light-emitting display device as claimed in claim 1, wherein the active layer includes an oxide semiconductor material.

3. The organic light-emitting display device as claimed in claim 2, wherein the oxide semiconductor material includes at least one of zinc oxide (ZnO), tin oxide (SnO), gallium-indium-zinc oxide (Ga—In—Zn—O), indium-zinc oxide (In—Zn—O), and indium-tin oxide (In—Sn—O).

4. The organic light-emitting display device as claimed in claim 3, wherein the active layer further comprises a dopant in the oxide semiconductor material, the dopant including aluminum (Al), nickel (Ni), copper (Cu), tantalum (Ta), hafnium (Hf), or titanium (Ti).

5. The organic light-emitting display device as claimed in claim 1, wherein the active layer includes polycrystalline silicon.

6. The organic light-emitting display device as claimed in claim 1, wherein the ion blocking layer includes a plurality of discrete segments, each segment corresponding to a respective thin-film transistor.

7. The organic light-emitting display device as claimed in claim 1, wherein the ion blocking layer is a single continuous element on the planarization layer.

8. The organic light-emitting display device as claimed in claim 1, wherein the first electrode and the ion blocking layer are insulated from each other by a portion of a pixel defining layer, the pixel defining layer directly covering top surfaces of each of the first electrode and the ion blocking layer, and the top surfaces of the first electrode and the ion blocking layer facing a same direction.

9. The organic light-emitting display device as claimed in claim 1, wherein each of the first electrode of the unit pixel and ion blocking layer is directly on the planarization layer, the entire first electrode being horizontally spaced apart from the ion blocking layer to overlap completely different portions of the substrate, and the bottom surfaces of the first electrode and ion blocking layer being flat.

10. The organic light-emitting display device as claimed in claim 1, wherein the first electrode and the ion blocking layer include a same material.

11. The organic light-emitting display device as claimed in claim 1, wherein the first electrode and the ion blocking layer include different materials.

12. The organic light-emitting display device as claimed in claim 1, wherein the ion blocking layer includes a conductive material.

13. The organic light-emitting display device as claimed in claim 1, further comprising a ground electrically connected to the ion blocking layer.

14. The organic light-emitting display device as claimed in claim 1, wherein the thin-film transistor has a bottom gate structure with a gate electrode between the substrate and the active layer, the gate electrode of the thin-film transistor and the first electrode of the unit pixel having a non-overlapping relationship.

15. A method of manufacturing an organic light-emitting display device, the method comprising:
forming a plurality of thin-film transistors on a substrate, each thin-film transistor including an active layer;
forming a planarization layer on the thin-film transistors, such that the thin-film transistors are covered;
forming a unit pixel on the planarization layer, the unit pixel including an organic light emitting layer between a first electrode and a second electrode;
forming the first electrode of the unit pixel and an ion blocking layer on the planarization layer, such that the first electrode is electrically connected to a thin-film transistor of the thin-film transistors and the blocking layer overlaps the active layer and is spaced apart along a horizontal direction from the entire first electrode, and such that bottom surfaces of the first electrode and the ion blocking layer are substantially coplanar;
forming a pixel defining layer, such that the ion blocking layer is covered and a part of the first electrode is exposed; and
forming an organic material layer and a second electrode on the first electrode to form a unit pixel.

16. The method as claimed in claim 15, wherein forming the first electrode and the ion blocking layer includes:
  forming a conductive layer on the planarization layer;
  forming a first mask pattern on the conductive layer; and
  removing a part of the conductive layer using the first mask pattern as an etching mask to form the first electrode and the ion blocking layer at the same time.

17. The method as claimed in claim 15, wherein forming the first electrode and the ion blocking layer includes:
  forming a second mask pattern on the planarization layer, such that a region of the ion blocking layer is covered and a region of the first electrode is exposed;
  forming the first electrode on the planarization layer exposed by the second mask pattern;
  removing the second mask pattern;
  forming a third mask pattern on the planarization layer, such that the first electrode is covered and a region of the ion blocking layer is exposed;
  forming the ion blocking layer on the planarization layer exposed by the third mask pattern; and
  removing the third mask pattern.

18. The method as claimed in claim 15, wherein forming the first electrode and the ion blocking layer includes:
  forming a fourth mask pattern on the planarization layer, such that a region of the first electrode is covered and a region of the ion blocking layer is exposed;
  forming the ion blocking layer on the planarization layer exposed by the fourth mask pattern;
  removing the fourth mask pattern;
  forming a fifth mask pattern on the planarization layer, such that the ion blocking layer is covered and a region of the first electrode is exposed;
  forming the first electrode on the planarization layer exposed by the fifth mask pattern; and
  removing the fifth mask pattern.

19. The method as claimed in claim 15, wherein forming the first electrode and the ion blocking layer includes:
  forming a sixth mask pattern on the planarization layer, such that a region of the first electrode and the ion blocking layer are exposed;
  forming the first electrode and the ion blocking layer at the same time on the planarization layer exposed by the sixth mask pattern; and
  removing the sixth mask pattern.

* * * * *